(12) United States Patent
Kuan et al.

(10) Patent No.: US 7,843,042 B2
(45) Date of Patent: Nov. 30, 2010

(54) WAFER LEVEL INTEGRATION PACKAGE

(75) Inventors: Heap Hoe Kuan, Singapore (SG); Seng Guan Chow, Singapore (SG); Linda Pei Ee Chua, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/493,108

(22) Filed: Jun. 26, 2009

(65) Prior Publication Data

US 2009/0261460 A1 Oct. 22, 2009

Related U.S. Application Data

(62) Division of application No. 11/765,930, filed on Jun. 20, 2007, now Pat. No. 7,553,752.

(51) Int. Cl.
 *H01L 23/552* (2006.01)
(52) U.S. Cl. .................... 257/660; 257/696; 257/698; 257/E23.114
(58) Field of Classification Search ......... 257/685–698, 257/659–660, 702.774, 778
 See application file for complete search history.

(56) References Cited

U.S. PATENT DOCUMENTS 6,958,544 B2  10/2005  Sunohara

| | | | |
|---|---|---|---|
| 2001/0004130 A1* | 6/2001 | Higashi et al. | 257/686 |
| 2002/0001922 A1* | 1/2002 | Farnworth | 438/464 |
| 2004/0156172 A1* | 8/2004 | Lin et al. | 361/704 |
| 2005/0121768 A1 | 6/2005 | Edelstein et al. | |
| 2006/0275946 A1 | 12/2006 | MacNamara et al. | |

\* cited by examiner

*Primary Examiner*—Dung A. Le
(74) *Attorney, Agent, or Firm*—Robert D. Atkins

(57) ABSTRACT

A semiconductor package has a first conductive layer formed on a top surface of a substrate. A conductive via is formed between the first conductive layer and a bottom surface of the substrate. A semiconductor component is mounted to the substrate and electrically connected to the first electrical contact pad. The semiconductor component can be a flip chip semiconductor device, wire bond semiconductor device, or passive component. An encapsulant is deposited over the semiconductor component. The encapsulant extends into a channel formed on a side of the substrate from the top surface to the bottom surface of the substrate. An interconnect structure is formed over the bottom surface of the substrate. A heat spreader structure can be disposed over the semiconductor component. An EMI shield can be disposed over the semiconductor component. A plurality of semiconductor components can be stacked in a package-in-package arrangement.

25 Claims, 8 Drawing Sheets

WAFER LEVEL INTEGRATION PACKAGE

CLAIM TO DOMESTIC PRIORITY

The present application is a division of, claims priority to, and fully incorporates herein by reference U.S. patent application Ser. No. 11/765,930, filed Jun. 20, 2007.

FIELD OF THE INVENTION

The present invention relates in general to semiconductor devices and, more particularly, semiconductor package devices.

BACKGROUND OF THE INVENTION

Semiconductors, or computer chips, are found in virtually every electrical product manufactured today. Chips are used not only in sophisticated industrial and commercial electronic equipment, but also in many household and consumer items such as televisions, clothes washers and dryers, radios, and telephones. As products become smaller and more functional, there is a need to include more chips in the smaller products to perform the functionality. The reduction in size of cellular telephones is one example of how more capabilities are incorporated into smaller electronic products.

As the demand for semiconductor devices with low-cost, high performance, increased miniaturization, and greater packaging densities has increased, devices having multiple dies, such as Multi-Chip Module (MCM) structures or similar stacked die structures have been developed to meet the demand. MCM structures have a number of dies and other semiconductor components mounted within a single semiconductor package. The number of dies and other components can be mounted in a vertical manner, a lateral manner, or combinations thereof.

One such approach is to stack one die on top of another die and then enclose the stack of dies in one package. The final package for a semiconductor with stacked dies is much smaller than would result if the dies were each packaged separately. In addition to providing a smaller size, stacked-die packages offer a number of advantages that relate to the manufacturing of the package, such as ease of handling and assembly.

In a stacked-die arrangement, the dies are wire-bonded sequentially, typically with automated wire-bonding equipment employing well-known thermal compression or ultrasonic wire-bonding techniques. During the wire-bonding process, the head of a wire-bonding apparatus applies a downward pressure on a conductive wire held in contact with a wire-bonding pad on the die to weld, or bond, the wire to the bonding pad on the die.

In many cases, stacked-die semiconductors can be fabricated faster and more cheaply than several semiconductors, each having a single die, which perform the same functions. A stacked-die approach is advantageous because of the increase in circuit density achieved and the ability to perform differing functionality, e.g., memory, logic, application specific integrated circuit (ASIC), within the same package. As a result, such multiple die package technologies as chip scale packaging (CSP), including ball grid array (BGA) and flip chip (bumped devices), and wafer level packaging (WLCSP) have been implemented. Further integration with passive devices using technologies such as System-in-Package (SiP) and chip scale module packaging (CSMP) have been commonly used.

However, the desire to achieve higher integration using the various technologies discussed previously generally causes a final package structure to be either larger in footprint or thicker. Greater integration has generally resulted in a tradeoff sacrifice of package miniaturization.

SUMMARY OF THE INVENTION

Therefore, a need exists for a package that allows higher integration of devices with differing functionality and yet maintains or decreases the package profile.

Accordingly, in one embodiment, the present invention is a semiconductor package comprising a substrate having a first contact pad formed into a top surface of the substrate. A through-hole interconnection extends downward through the substrate from the first contact pad to a bottom surface of the substrate. A die is mounted to the substrate and electrically connected to the first contact pad. An encapsulant is deposited over the die and in a channel formed along a side of the substrate. An interconnect structure is formed over the bottom surface of the substrate.

In another embodiment, the present invention is a semiconductor package comprising a substrate and first contact pad formed on a top surface of the substrate. A conductive via is formed below the first contact pad and extending through the substrate to a bottom surface of the substrate. A semiconductor component is mounted to the substrate and electrically connected to the first contact pad. An encapsulant is deposited over the semiconductor component and in a channel formed along a side of the substrate. An interconnect structure is formed over the bottom surface of the substrate.

In another embodiment, the present invention is a semiconductor package comprising a substrate and first conductive layer formed on a top surface of the substrate. A conductive via is formed between the first conductive layer and a bottom surface of the substrate. A semiconductor component is mounted to the substrate and electrically connected to the first conductive layer. An encapsulant is deposited over the semiconductor component. The encapsulant covers a side of the substrate from the top surface to the bottom surface of the substrate.

In another embodiment, the present invention is a semiconductor package comprising a substrate and first conductive layer formed on a top surface of the substrate. A conductive via is formed between the first conductive layer and a bottom surface of the substrate. A semiconductor component is mounted to the substrate and electrically connected to the first conductive layer. An encapsulant is deposited over the semiconductor component.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor package can be manufactured which takes into account a stacked-die arrangement and serves to alleviate many of the problems previously described, while providing increasingly smaller sizes. The package can be manufactured more easily and with greater efficiency than previous packages, resulting in a package with lower overall manufacturing cost. Finally, the reliability of semiconductor packages having stacked dies is increased by use of the following designs and methods of manufacture.

Figure 1A:
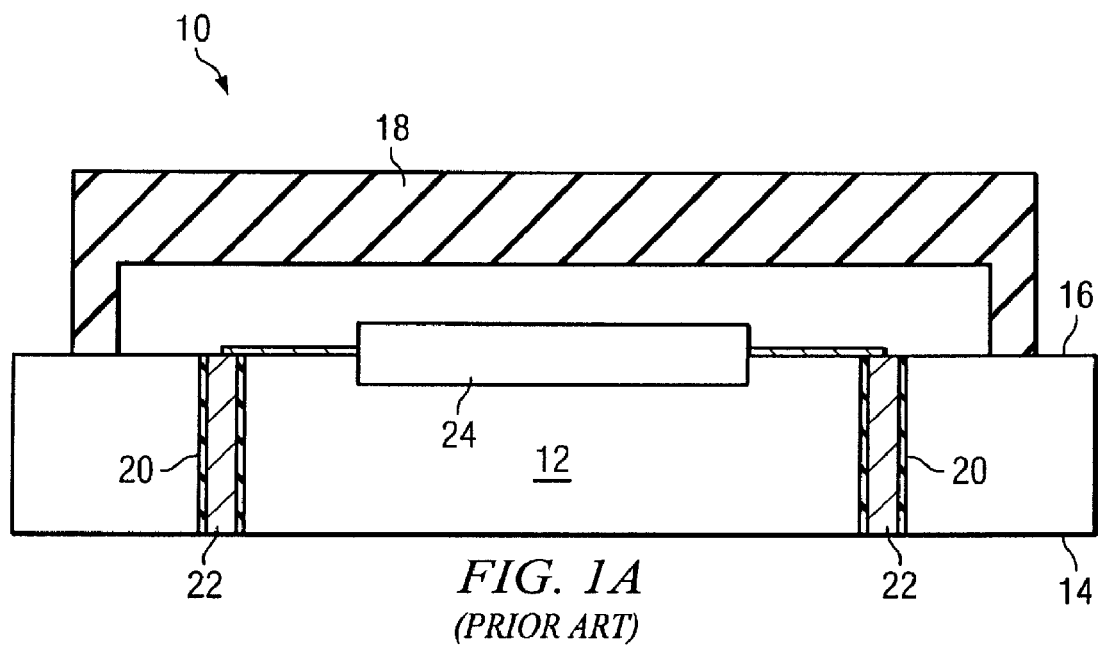
FIG. 1A illustrates an exemplary prior art semiconductor device.

Turning to FIG. 1A, an exemplary prior art semiconductor device 10 is illustrated. Device 10 includes a wafer or substrate 12 having a top surface 16 and a bottom surface 14. A cap 18 is disposed over the top surface to enclose electrical component 24. A dielectric liner 20 is disposed through a via in wafer 12 extending from top surface 16 to bottom surface 14. The via is filled with conductive material 22 as shown.

Figure 1B:
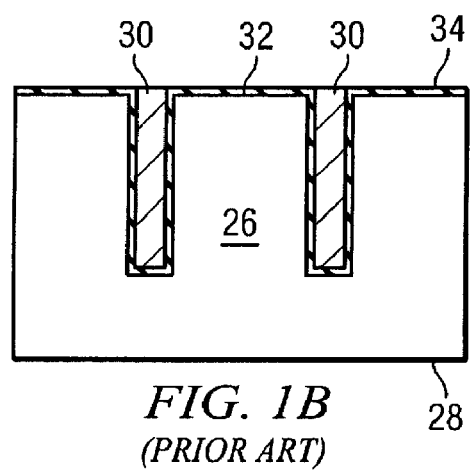
FIG. 1B illustrates a first exemplary prior art semiconductor substrate.
Figure 1C:
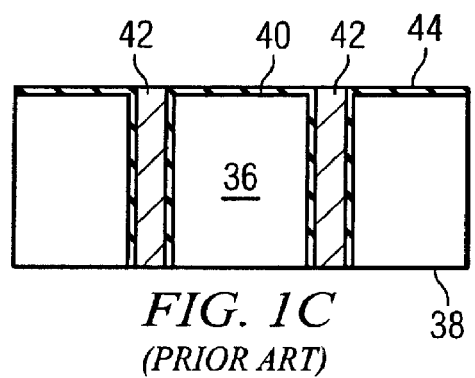
FIG. 1C illustrates a second exemplary prior art semiconductor substrate.

FIGS. 1B and 1C further illustrate various prior art embodiments of the via structure. In FIG. 1B, substrate 26 includes a bottom surface 28 and top surface 34. A conductive material 30 is disposed between surfaces 32 disposed in trenches in wafer 26. Similarly, FIG. 1C includes another wafer 36 having a bottom surface 38 and top surface 44, where a conductive material 42 is disposed within surfaces 40 which line the vias in the wafer.

The present invention improves upon such methods and techniques as seen in the prior art, to render a semiconductor device which is smaller in height and footprint, more efficient to manufacture, and results in higher performance.

Figure 2A:
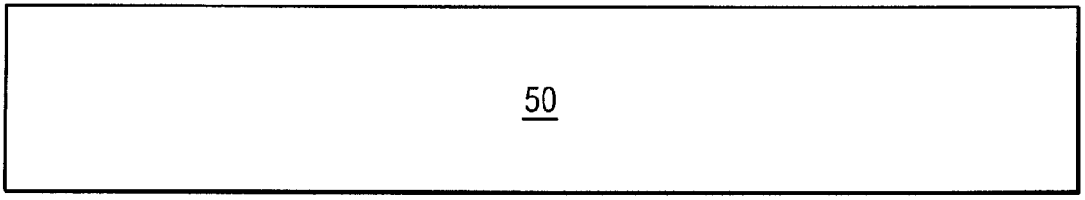
FIG. 2A illustrates a first step in an exemplary method of forming a semiconductor device.

FIG. 2A illustrates a first step in an exemplary method of forming a semiconductor device according to the present invention. A wafer 50 has a silicon substrate. Wafers and similar substrates 50 can be provided which vary in size and depth for a particular application.

Figure 2B:
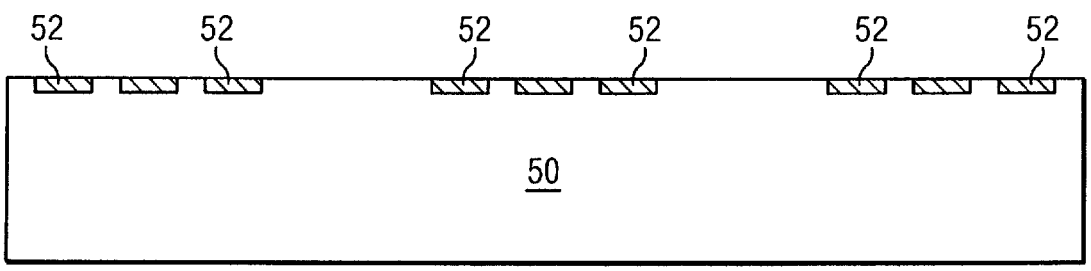
FIG. 2B illustrates a second step in the exemplary method begun in FIG. 2A.

A second step in the exemplary method of forming a semiconductor device begun with FIG. 2A is shown in FIG. 2B. A series of electrical contact pads 52 are formed as redistribution layers (RDLs) or flex-on-cap (FOC) process. FOC involves vertically disposing the solder ball directly over an under-bump metallization (UBM) which overlies a bonding pad to a wafer. RDL involves laterally separating the location of the solder ball from the wafer bonding pad, although the solder ball remains electrically connected to the bonding bad by the RDL track. In either case, pads 52 are integrated into a top surface of wafer 50.

Figure 2C:
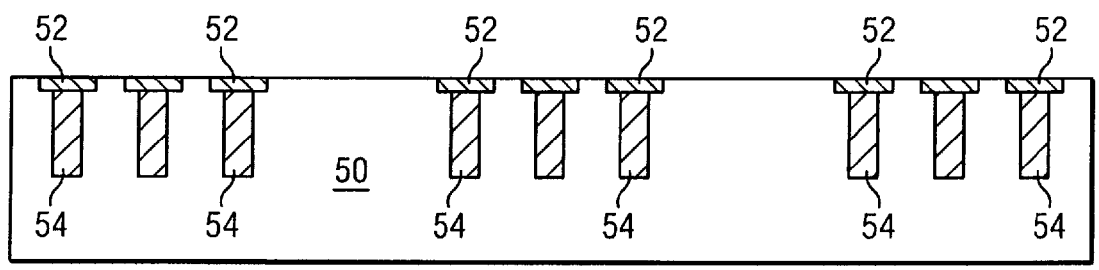
FIG. 2C illustrates a third step in the exemplary method begun in FIG. 2A.

A third step in the exemplary method is seen in FIG. 2C, where a series of through-hole interconnections 54 are formed in substrate 50. The interconnections 54 can be etched in the substrate and filled with a conductive material, or similar techniques can be utilized. In various embodiment, the through-hole interconnections can extend to depths varying between thirty to one-hundred fifty micrometers (um).

As a next fourth step in the exemplary method, a flip chip or similar die 58, such as a wire-bondable die is attached to through-hole interconnections 54. A series of bumps 60 can provide electrical connectivity from die 58 to through-hole interconnections 54. An optional underfill material 56 can be deposited between die 58 and the top surface of substrate 50.

Figure 2D:
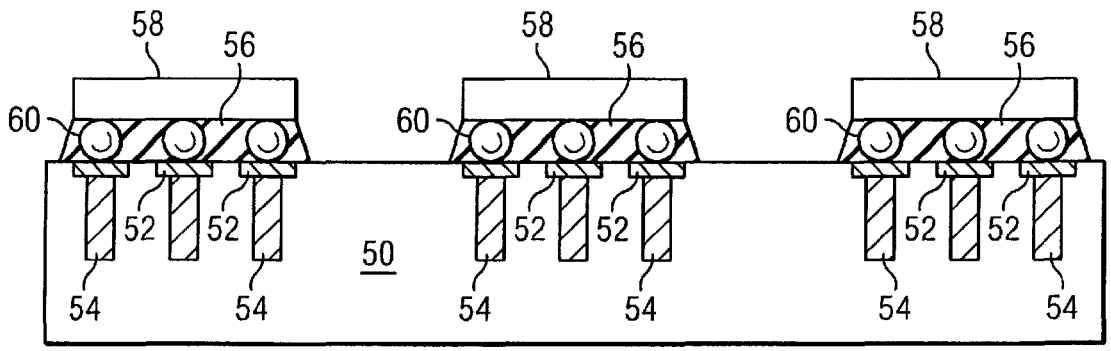
FIG. 2D illustrates a fourth step in the exemplary method begun in FIG. 2A.

At the conclusion of the fourth step, a series of dies 58 are electrically connected to a plurality of through-hole interconnections 54, which are partially disposed through wafer 50. Again, as FIG. 2D represents a partial cross-section, any number of dies 58 can be provided, in a variety of configurations to suit particular applications.

Figure 2E:
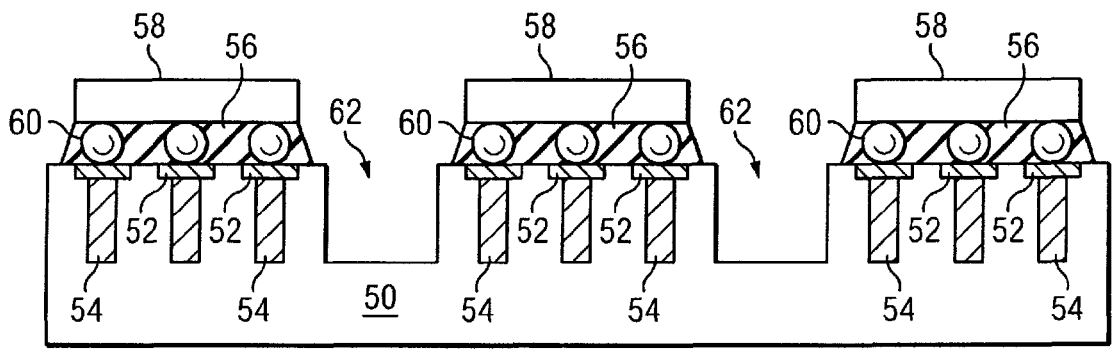
FIG. 2E illustrates a fifth step in the exemplary method begun in FIG. 2A.

FIG. 2E represents a fifth step in the exemplary method of forming a semiconductor device. As shown, a series of channels, trenches or voids 62 are formed between each respective assembly of interconnections 54, pads 52, and die 58. The various electrical connections and support mechanisms between dies 58 and interconnections 54 and pads 52 can include bumps 60 and/or underfill material 56.

Figure 2F:
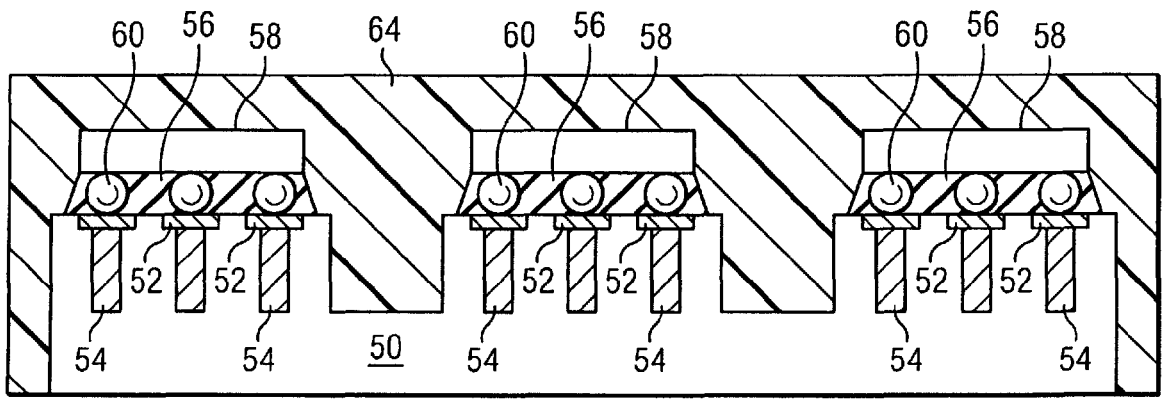
FIG. 2F illustrates a sixth step in the exemplary method begun in FIG. 2A.

An encapsulant 64 is disposed over the respective assemblies as seen in FIG. 2F, which depicts a sixth step in the exemplary method of forming a semiconductor device. Encapsulant 64 coats respective surfaces of dies 58, optional underfill material 56, and surfaces of wafer 50. Each of the channels 62 are filled with encapsulant 64. Encapsulant 64 can include polymer materials, organic material, and other encapsulating material. Encapsulant 64 provides structural support to the various components, e.g., die 58, in the semiconductor device.

Figure 2G:
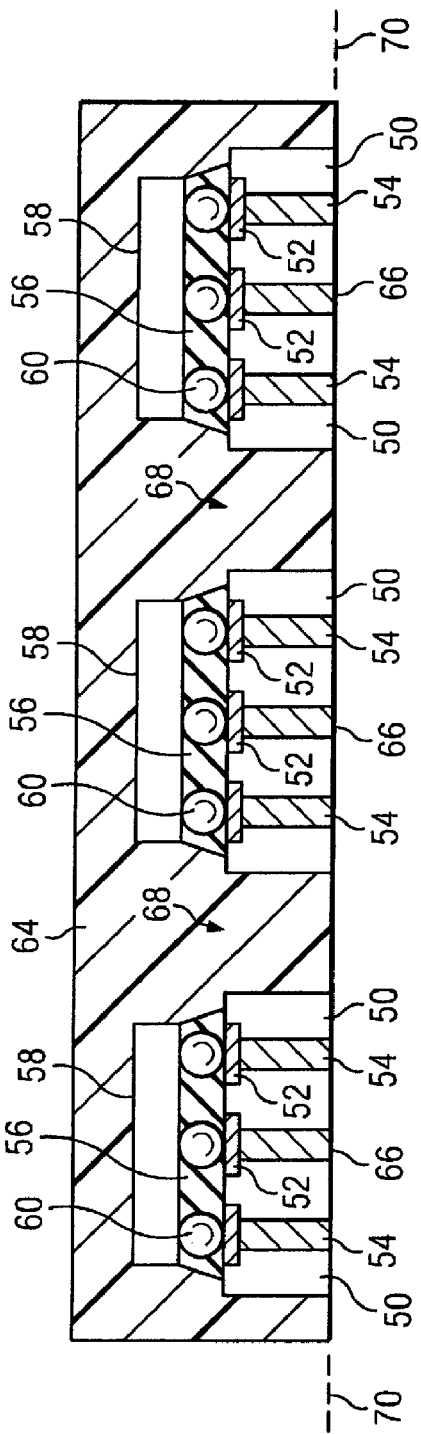
FIG. 2G illustrates a seventh step in the exemplary method begun in FIG. 2A.

Wafer 50, in a seventh step in the exemplary method of forming a semiconductor device depicted by FIG. 2G, undergoes a backgrinding operation to remove material from a bottom or back portion of wafer 50. Surface 70 results from the backgrinding operation, where once connecting portions of wafer structure 50 are removed, as denoted by arrow 68. Each of the respective assemblies remain connected by a layer of encapsulant 64.

A bottom surface 66 of through-hole interconnections 54 is exposed by use of the backgrinding process. As seen in FIGS. 2F and 2G, channels 62 are formed to roughly correspond to the depth of the plurality of interconnections 54, so that when the connecting portions of wafer 50 are removed, surfaces 66 of interconnections 54 are exposed.

Figure 2H:
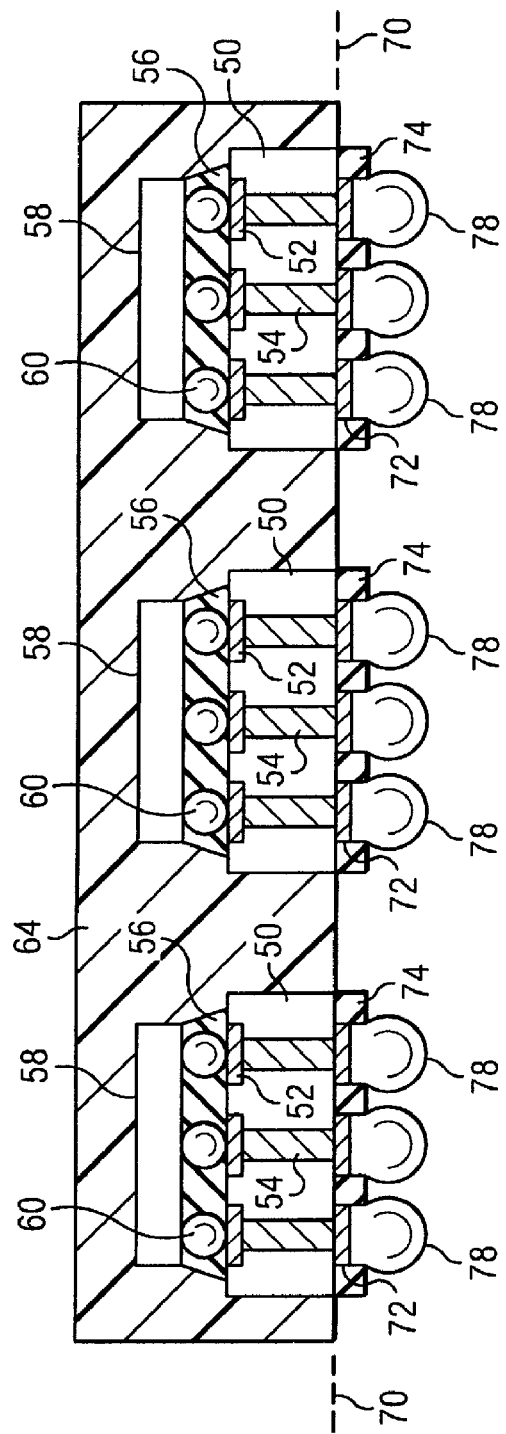
FIG. 2H illustrates an eighth step in the exemplary method begun in FIG. 2A.

FIG. 2H illustrates a next, eighth step in the exemplary method of forming a semiconductor device. A plurality of backside pads 72 are electrically connected to surfaces 66 of interconnections 54. Pads 72 can be formed in much the same manner as pads 52, using RDL or FOC, incorporated into a top side of wafer 50 as previously seen. A dielectric layer 74 is disposed along the back side or bottom surface 70 of the wafer. Dielectric layer 74 is disposed along a side surface of pads 72. Layer 74 surrounds and isolates pads 72 and provides structural support across bottom surface 70 of wafer 50.

A series of solder balls 78 can then be attached or otherwise coupled and/or connected to each of pads 72 in a next, ninth step in the depicted exemplary method of forming a semiconductor device. Each of the assemblies can be optionally function-tested to determine if respective electrical connections are satisfactorily made.

Figure 2I:
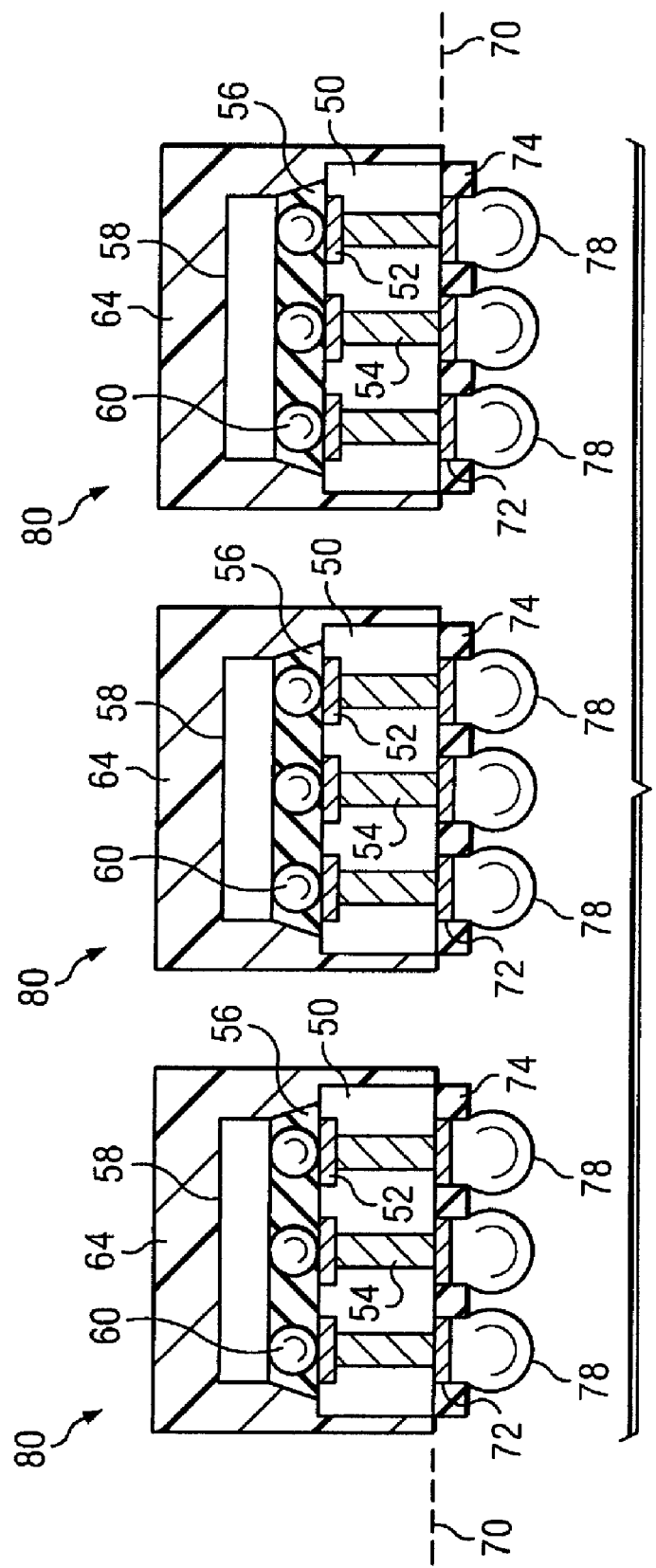
FIG. 2I illustrates a ninth step in the exemplary method begun in FIG. 2A.

As a final step, each of the respective assemblies 80 can then be singulated into semiconductor devices 80 as seen in FIG. 2I. In one embodiment, the final semiconductor device 80 includes balls 78, which electrically connect semiconductor device 80 to another structure. Backside pads 72 are coupled to through-hole interconnections 54 and to topside pads 52. A die 58 is connected to topside pads 52 using bumps 60 and anchored by underfill material 56.

In one exemplary method of forming semiconductor device 80, a wafer can first be provided which has a series of first electrical contact pads integrated into a top surface of the wafer. A through-hole interconnection can then be formed which extends downward from a first surface of the first electrical contact pad. A die can be then attached to a second surface of the electrical contact pads. The wafer can be cut to form a channel portion and a connecting portion. An encapsulant can then be disposed over the die and the channel portion. The wafer can then undergo a backgrinding process to remove the connecting portion and expose a surface of the through-hole interconnection. A second series of electrical contact pads can be disposed over the surface of the through-hole interconnection. A dielectric layer along a side surface of the second pads. A ball can be then coupled to the second pads to provide electrical connectivity.

Figure 3:
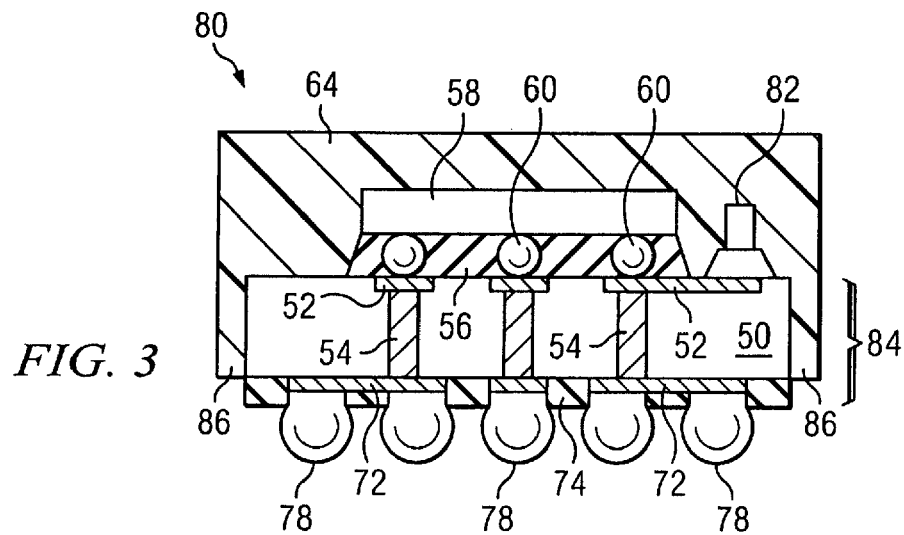
FIG. 3 illustrates a first exemplary embodiment of a semiconductor device incorporating a flip chip integrated circuit.

Turning to FIG. 3, a first exemplary embodiment of a semiconductor device 80 incorporating a flip chip IC die 58 is seen. Device 80 can be referred to as a wafer level integration package device 80. Device 80 includes such previously mentioned structures as pads 52, optional underfill layer 56, bumps 60, encapsulant 64, pads 72, dielectric layer 74, and balls 78.

In addition to the aforementioned structures, device 80 includes a passive component 82 such as a filter, balun, inductor, capacitor, resistor, or a similar electrical device 82, which is integrated into device 80 and electrically connected to the device through a portion of pads 52 as shown. The embedded passive component can perform such functionality as providing capacitance, inductance, resistance, or a combination of functions.

The wafer structure 50 in the instant embodiment incorporates a double-sided integration circuit 84. The double-sided integration circuit 84 is an active integrated circuit device. Device 84 can perform such functionality as logic, memory, application specific (ASIC), or embedded integrated passive device (IPD). The double-sided integration circuit can function as a semiconductor interposer, in that the wafer can provide structural support without providing additional electronics functionality; yet function to provide the distribution of electrical signals from a source to a destination.

Device 84 can route signals on both the top and bottom surfaces of the device. Signal routes can be provided by having single or multiple pads 52 and 72 along the X-Y directions. A series of through-hole interconnections 54 routes signals along the Z direction.

Device 84 can include various interconnection pads to accommodate such signal transfer mediums as wire, bumps, and other passive component interconnections as will be further described. Device 84, as with other materials comprising the overall semiconductor device 80, can include silicon (Si), gallium arsenide (GaAs), or any other suitable semiconductor material or a combination thereof.

The side walls of the double-sided integration circuit 84 are protected by encapsulant 64, as denoted by arrows 86. As a result, the wafer level integration device 80 is made more reliable and more resilient, particularly to handling steps.

Wafer level integration packages such as package/device 80 can include single or multiple integrated circuit (IC) devices which can be attached onto a top or a bottom side of the double-sided integration circuit device 84. The IC devices can be wire-bondable, flip chip, passive components, or a combination thereof. The IC devices can be arranged in a side-by-side configuration or by stacking. The various configurations are applicable to both respective top and bottom sides of the double-sided integration circuit device 84.

Package/device 80 can be used as an inner stacking module (ISM) for package-in-package configuration, as will be later described. Package/device 80 can also be used as a conventional ball grid array (BGA) package 80, whereby package 80 can be attached onto a substrate for further packaging and/or testing.

Figure 4:
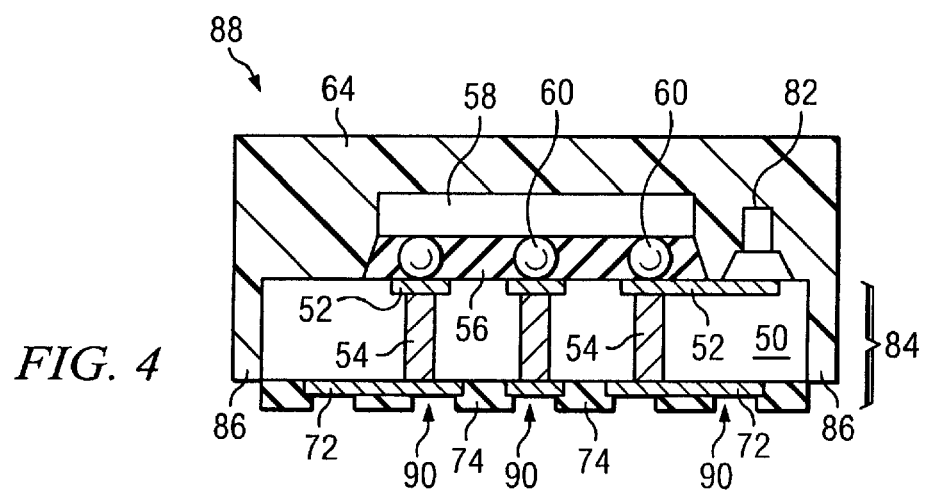
FIG. 4 illustrates a second exemplary embodiment of a semiconductor device including a plurality of lands.

Turning to FIG. 4, a second exemplary embodiment of a wafer level integration package 88 is shown. Package 88 includes a passive device 82 as previously seen. Dielectric layer 74 as configured and formed renders a series of lands 90 which expose pads 72. The lands 90 can be intended to provide electrical connectivity for specific applications. The lands 90 can be formed in a variety of configurations to expose as much or as little of a portion of a respective pad 72 as needed.

Figure 5:
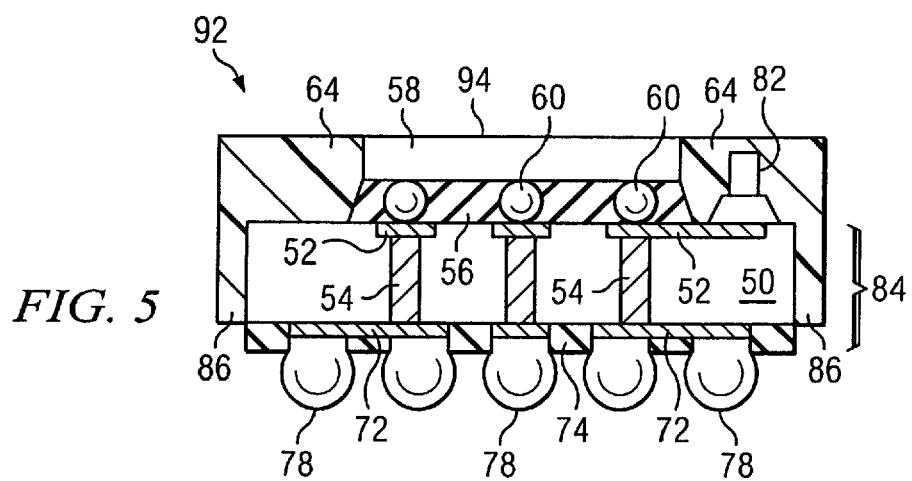
FIG. 5 illustrates a third exemplary embodiment of a semiconductor device where a top surface of an integrated die is left exposed.

FIG. 5 illustrates an additional, third embodiment of a wafer level integration package 92, where the incorporated flip chip IC 58 has an exposed top surface 94. In the instant embodiment, encapsulant 64 is formed such that the top surface of flip chip IC 58 is exposed for a particular application, such as to provide a smaller, thinner package 92. Encapsulant 64 can be deposited such that surface 94 is exposed, or surface 94 can be later exposed through a grinding procedure or a similar mechanical operation to reduce the coverage of encapsulant 64.

Figure 6:
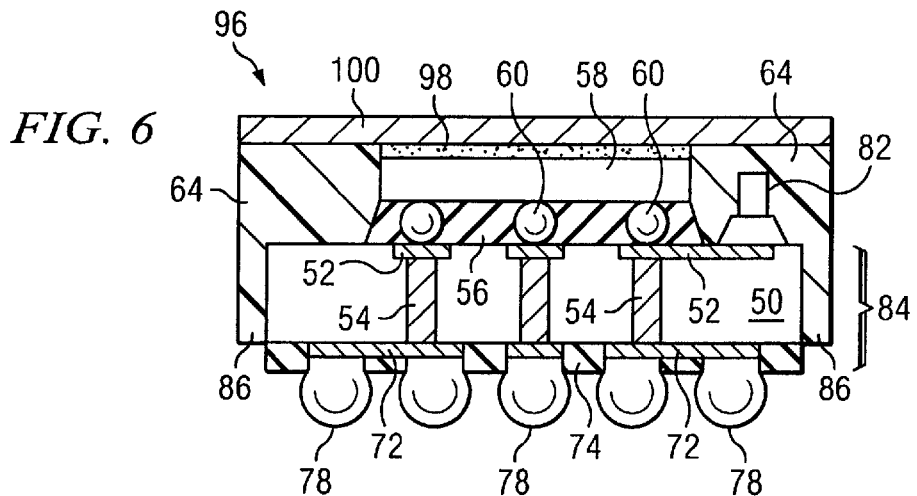
FIG. 6 illustrates a fourth exemplary embodiment of a semiconductor device incorporating a heat spreader structure to provide thermal enhancement.

A variant of the exposed surface package 92 is seen in FIG. 6 as a thermally enhanced wafer level integration package 96, where an adhesive material 98 is disposed over the top surface of die 58. The adhesive couples a heat spreader 100 structure to the top surface of die 58 to dissipate heat across the top surface of the package. The heat spreader 100 can also incorporate other thermal characteristics to enhance the overall performance of package 96 in certain conditions.

Figure 7:
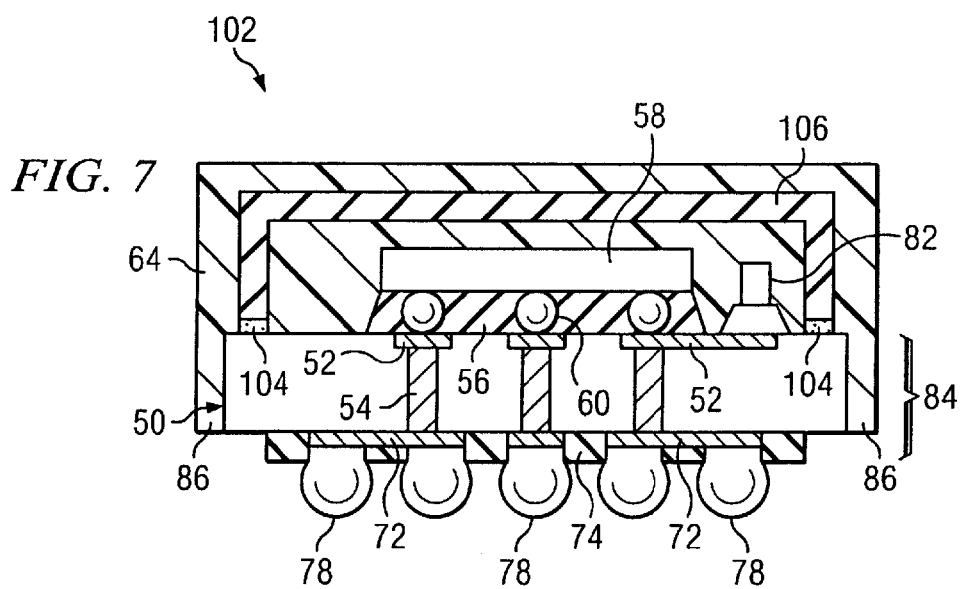
FIG. 7 illustrates a fifth exemplary embodiment of a semiconductor device incorporating an electrical shield structure.

FIG. 7 illustrates a wafer level integration package 102, which incorporates an electrical shield structure 106. The electrical shield structure 106 is coupled to a portion of wafer 50 using an adhesive structure 104 and surrounds and shields electrical components, i.e., die 58 and/or other passive components 82, which are housed interior to shield structure 106. Structure 106 and adhesive mounts 104 are surrounded by encapsulant 64 to provide additional structural support to package 102. The shield is made of metal cap with holes to allow encapsulation. The shield prevents signal interference between devices within the package as well as outside package. Any interference will distort signal transmission, which can be problematic in RF applications.

Figure 8:
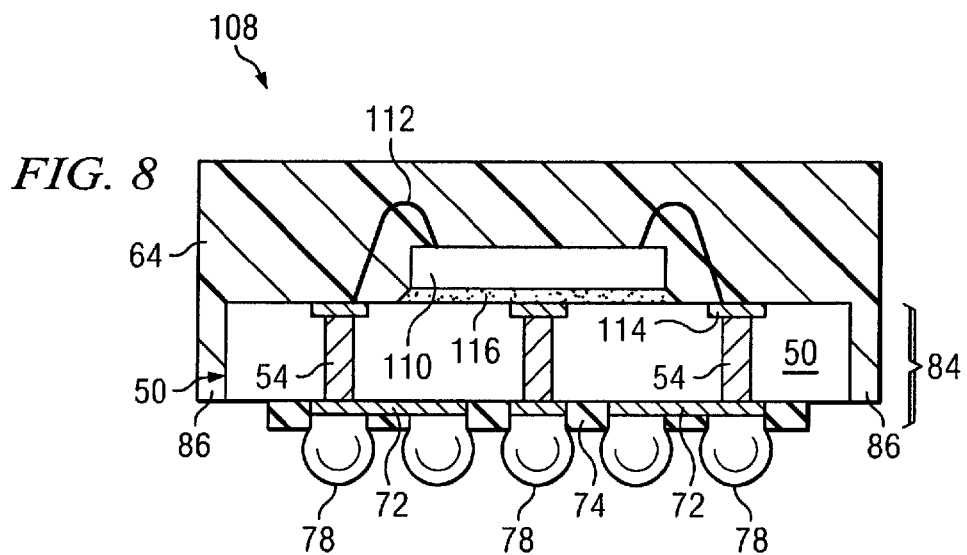
FIG. 8 illustrates a sixth exemplary embodiment of a semiconductor device incorporating a wire-bonded integrated circuit.

FIG. 8 illustrates an additional embodiment of a wafer level integration package 108 incorporating a wire-bondable die 110, which is connected by wires 112 to wire-bonding pads 114. Wire-bonding pads 114 are integrated into the topside of wafer 50 in a manner similar to pads 52. Pads 52 can be modified to accept wire-bonding as indicated. Wire-bond IC 110 and wires 112 are covered with encapsulant 64 to provide structural support.

Figure 9:
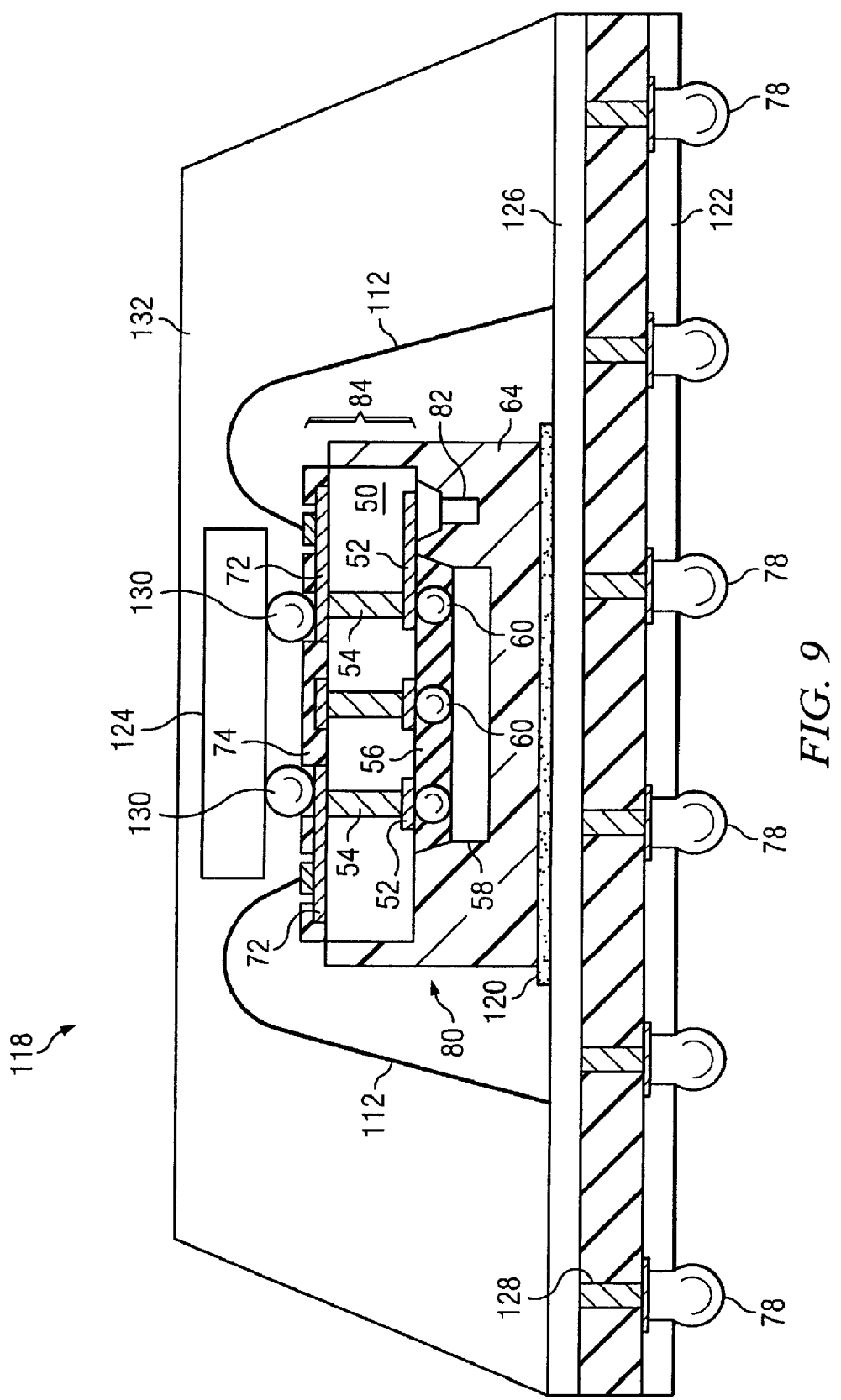
FIG. 9 illustrates a seventh exemplary embodiment of a semiconductor device employing package-in-package technologies.

In an additional embodiment, FIG. 9 illustrates a wafer level integration package 80 which is then disposed over a bumped substrate to render a package-in-package (PiP) 118 configuration. Package 80 serves as an ISM, as previously described, for PiP implementations.

A die adhesive 120 is utilized to mount the wafer level integration package 80 to a surface of a bumped substrate 122. A series of vias 128 or similar structures carry electrical signals through substrate 122 to a series of balls 78, which are disposed on a bottom surface of substrate 122.

An additional die or package 124 is disposed over device 80. Die or package 124 is electrically connected to device 80 using bumps 130. A bump pad 72 carries electrical signals over a wire 112 to an electrical terminal 126 of bumped substrate 122.

A second encapsulant 132 is disposed over package 80 and package 124 or die 124 as seen to form a complete package-in-package configuration 118. A variety of dies or packages 124 can be incorporated with device 80 to suit a particular application.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor package, comprising:
   a double-sided substrate having an active surface and second surface opposite the active surface;
   a through-hole interconnect structure extending through the double-sided substrate from the active surface to the second surface;
   a first conductive layer formed over the active surface and electrically connected to the through-hole interconnect structure;
   a semiconductor die mounted to the active surface of the double-sided substrate and electrically connected to the first conductive layer;
   an encapsulant deposited over the semiconductor die and double-sided substrate and further along a sidewall of the double-sided substrate extending from the active surface to the second surface;
   a second conductive layer formed over the second surface and electrically connected to the through-hole interconnect structure; and
   a dielectric layer formed over the second surface creating a land while surrounding and isolating the second conductive layer.

2. The semiconductor package of claim 1, wherein the semiconductor die includes a flip chip semiconductor device, wire bond semiconductor device, or passive component.

3. The semiconductor package of claim 1, further including a heat spreader structure disposed over the semiconductor die.

4. The semiconductor package of claim 1, further including an electromagnetic interference shield disposed over the die.

5. The semiconductor package of claim 1, further including a passive component mounted to the double-sided substrate and electrically connected to the first conductive layer.

6. The semiconductor package of claim 1, further including a plurality of die stacked in a package-in-package arrangement.

7. The semiconductor package of claim 1, wherein a surface of the semiconductor die is exposed from the encapsulant.

8. The semiconductor package of claim 1, further including an underfill material disposed between the semiconductor die and the double-sided substrate to provide structural support.

9. A semiconductor package, comprising:
   a double-sided substrate having an active surface and second surface opposite the active surface;
   a conductive via formed from the active surface and extending through the double-sided substrate to the second surface;
   a first conductive layer formed over the active surface and electrically connected to the conductive via;
   a semiconductor component mounted to the active surface of the double-sided substrate and electrically connected to the first conductive layer and conductive via;
   an encapsulant deposited over the semiconductor component, over the double-sided substrate, and in a channel formed along a side of the double-sided substrate;
   a second conductive layer formed over the second surface and electrically connected to the conductive via; and
   a dielectric layer formed over the second surface surrounding and isolating the second conductive layer.

10. The semiconductor package of claim 9, wherein the semiconductor component includes a flip chip semiconductor device, wire bond semiconductor device, or passive component.

11. The semiconductor package of claim 9, further including a heat spreader structure disposed over the semiconductor component.

12. The semiconductor package of claim 9, further including an electromagnetic interference shield disposed over the semiconductor component.

13. The semiconductor package of claim 9, further including a passive component mounted over the double-sided substrate and electrically connected to the first conductive layer.

14. The semiconductor package of claim 9, further including a plurality of semiconductor components stacked in a package-in-package arrangement.

15. The semiconductor package of claim 9, wherein a surface of the semiconductor component is exposed from the encapsulant.

16. A semiconductor package, comprising:
   a substrate with a wafer-form factor having an active surface and second surface opposite the active surface;
   a conductive via formed between the active surface and second surface;
   a first conductive layer formed over the active surface and electrically connected to the conductive via;
   a semiconductor component mounted over the substrate and electrically connected to the first conductive layer and the conductive via;
   a channel extending from the active surface partially through the substrate;
   an encapsulant deposited over the substrate, semiconductor component, and into the channel wherein:
      the substrate is backgrinded to expose the encapsulant in the channel and the conductive via; and
   an interconnect structure formed over the second surface.

17. The semiconductor package of claim 16, wherein the interconnect structure includes:
- a contact pad formed over the second surface and electrically connected to the conductive via; and
- a dielectric layer formed over the second surface and around the contact pad.

18. The semiconductor package of claim 16, further including a heat spreader structure disposed over the semiconductor component.

19. The semiconductor package of claim 16, further including an electromagnetic interference shield disposed over the semiconductor component.

20. The semiconductor package of claim 16, further including an underfill material disposed between the semiconductor component and substrate to provide structural support.

21. A semiconductor package, comprising:
- a substrate;
- a first conductive layer formed over a first surface of the substrate;
- a conductive via formed between the first conductive layer and a second surface of the substrate;
- a semiconductor component mounted to the substrate and electrically connected to the first conductive layer; and
- an encapsulant deposited over the semiconductor component and covering a side of the substrate from the first surface to the second surface of the substrate.

22. The semiconductor package of claim 21, further including an interconnect structure formed over the bottom surface of the substrate.

23. The semiconductor package of claim 21, further including a heat spreader structure disposed over the semiconductor component.

24. The semiconductor package of claim 21, further including an electromagnetic interference shield disposed over the semiconductor component.

25. The semiconductor package of claim 21, further including a plurality of semiconductor components stacked in a package-in-package arrangement.

* * * * *